United States Patent [19]

Soma et al.

[11] 4,399,512
[45] Aug. 16, 1983

[54] WAVEFORM SEARCHING SYSTEM

[75] Inventors: Masafumi Soma, Fussa; Yoshihiko Kohno, Kokubunji, both of Japan

[73] Assignee: Iwasaki Tsushinki Kabushiki Kaisha, Tokyo, Japan

[21] Appl. No.: 217,462

[22] Filed: Dec. 17, 1980

[30] Foreign Application Priority Data

Dec. 27, 1979 [JP] Japan ............................. 54-169455

[51] Int. Cl.³ .......................................... H01J 29/70
[52] U.S. Cl. .................................. 364/487; 364/521; 340/722; 324/121 R
[58] Field of Search ............... 364/487, 521, 607, 851; 324/121 R, 102, 77 R; 340/715, 722

[56] References Cited

U.S. PATENT DOCUMENTS

| | | | |
|---|---|---|---|
| 3,500,183 | 3/1970 | McCutcheon et al. | 324/121 R |
| 4,000,439 | 12/1976 | McCutcheon et al. | 324/77 R |
| 4,039,784 | 8/1977 | Quarton et al. | 364/521 |
| 4,072,851 | 2/1978 | Rose | 364/487 |
| 4,104,725 | 8/1978 | Rose et al. | 364/487 |
| 4,142,146 | 2/1979 | Schumann et al. | 364/487 |
| 4,257,043 | 3/1981 | Tsuchiko | 324/121 R |

*Primary Examiner*—Gary Chin

*Attorney, Agent, or Firm*—Robert E. Burns; Emmanuel J. Lobato; Bruce L. Adams

[57] ABSTRACT

A waveform searching system for a sampling oscilloscope, in which the instantaneous level of a high-speed sawtooth signal generated by a trigger signal synchronized with an input analog signal and the instantaneous level of a properly attenuated or amplified X-axis sweep wave are compared with each other to generate a pulse in a case of coincidence therebetween, thereby to generate sampling pulses sequentially delayed after the trigger signal by a constant time; the input analog signal is sampled by the sampling pulses to produce sampled pulses; and the sampled pulses are displayed by the X-axis sweep signal on a CRT. In accordance with the present invention, there are provided detecting means for detecting a predetermined condition where a waveform formed by respective peak values of the sampled pulses cross in a predetermined direction at a predetermined search level by a predetermined number; and control means for sequentially changing a time base range until the detecting means detects the predetermined condition, whereby the sampled pulses having the predetermined condition are automatically displayed on the CRT.

2 Claims, 5 Drawing Figures

WAVEFORM SEARCHING SYSTEM

FIELD OF THE INVENTION

The present invention relates to a waveform searching system for a sampling oscilloscope which includes an automatic delay setting function for automatically displaying a significant part of an input signal on a CRT and an auto-range function.

BACKGROUND OF THE INVENTION

It is possible, of course, to observe a periodic, high-speed analog signal (hereinafter referred to as a signal to be measured) by a conventional sampling oscilloscope. In general, however, the sampling oscilloscope needs a trigger signal, which bears a certain time relationship, i.e. a synchronous relationship to the signal to be measured, and requires an observer to properly set a delay time, the X-axis level (the time-base) and the Y-axis gain (sensitivity) for displaying the signal to be measured on a CRT for waveform observation and measurement; namely, the conventional sampling oscilloscope has a defect such that operations for the waveform observation and measurement are complex. In particular, for testing whether or not a significant part of the signal to be observed can be observed in a certain time-based range, it is necessary to manually adjust a delay over the entire observable range of delay in the time-based range.

Another prior art example is U.S. Pat. No. 4,000,439, in which a potential of 0.7 volts at the start of a low-speed sawtooth wave is compared with the instantaneous level of an input signal, so that a searched result optimal to observation cannot always be effected for the state of the input signal and the trigger signal.

SUMMARY OF THE INVENTION

An object of the present invention is to provide a waveform searching system for a sampling oscilloscope which permits an automatic display of an input signal meeting with a predetermined set condition.

To achieve the above object, in accordance with the present invention, the number of times at which the slope of an input signal crosses a search level in a predetermined direction within a certain time axis range is preset; one search sweep wider than a normal sweep range is carried out; and a delay time is automatically set so that a part of the input signal meeting with search conditions such as the abovesaid search level and so on may automatically be displayed on a CRT. If there is no such part on the input signal satisfying the search conditions, the time axis range is automatically changed by one step; and the search sweep is continued until the search conditions are fulfilled, whereby the input signal is automatically displayed on the CRT.

BRIEF DESCRIPTION OF THE DRAWINGS

The principle, construction and operation of the present invention will be clearly understood from the following detailed description taken in conjunction with the accompanying drawings, in which.

DETAILED DESCRIPTION OF THE INVENTION

Figure 1:
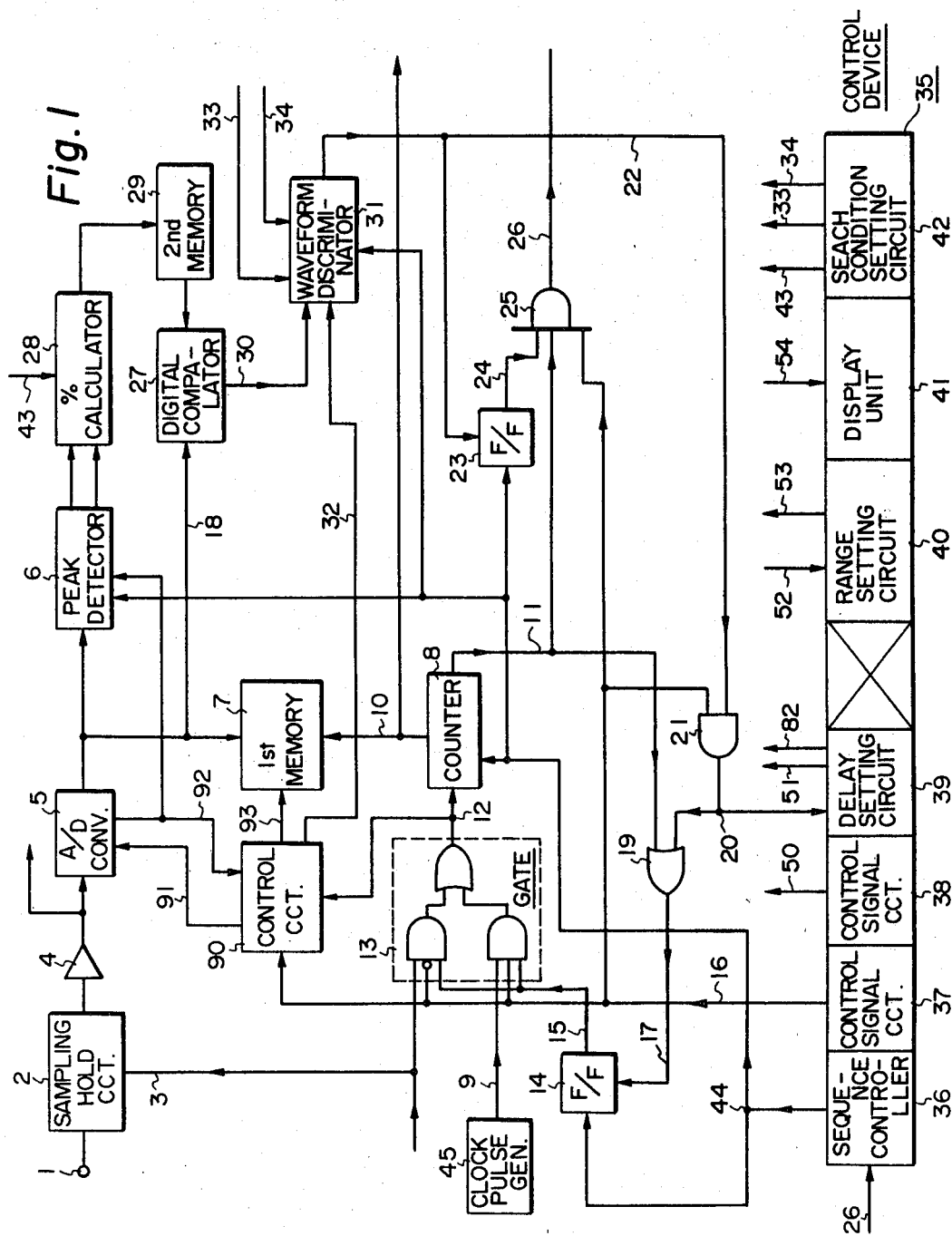
FIGS. 1 and 2 are block diagrams illustrating an embodiment of the present invention.
Figure 2:
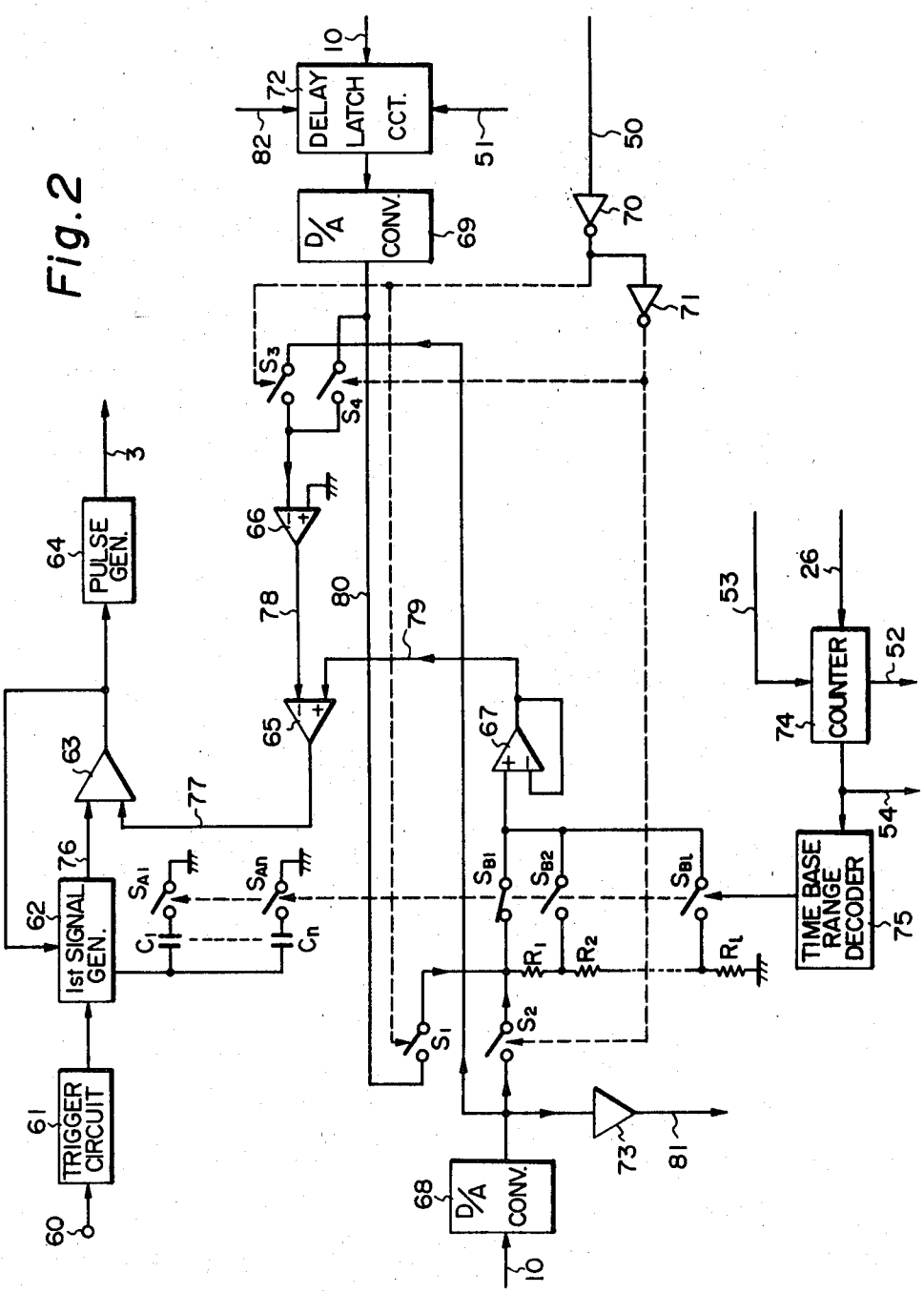

With reference to FIGS. 1 and 2 illustrating an embodiment of the present invention, reference numeral 1 indicates an input terminal for receiving a signal to be measured; 2 designates a sampling hold circuit for sampling the signal from the input terminal 1 by sampling pulses 3 and for holding each sampled value until a just succeeding sampling pulse; 4 identifies a buffer amplifier for the signal held by the sampling hold circuit; 5 denotes a 10-bit A/D converter for converting the output analog signal from the buffer amplifier 4 to a digital form in synchronism with the sampling pulses 3; 6 represents a peak detector for detecting the maximum value and the minimum value of the 10-bit digital value train; 7 shows a first memory of 10-bit 1 kilo-words for storing the 10-bit digital value train at addresses which are successively designated by the counting value of a counter 8; 8 refers to a counter which is driven by clock pulses 12 described later; 10 indicates a counter output of binary 10-bit, which serves as an address signal of the first memory 7 and a signal for determining the X-axis position of a display; 11 refers to a counting end signal; 12 identifies drive pulses for the counter 8 which are derived from the sampling pulses 3 or clock pulses 9 gated by a gate circuit 13; 14 denotes a flip-flop which is set by a preset start signal 44 from a sequence controller 36 and reset by a sequence end signal 17; 15 represents the output signal from the flip-flop 14; 16 shows a signal which is supplied from a control signal circuit 37 to determine whether to sample the input signal or to read out contents of the first memory 7; 17 refers to a sequence end signal from an OR gate 19 through which the counting end signal 11 and a delay time establish signal 20 are passed; 18 indicates a 10-bit bi-directional data bus connected to the 10-bit A/D converter 5, the peak detector 6, the first memory 7 and digital comparator 27; 19 designates a two-input OR gate; 20 identifies a delay establish signal which is developed by an AND gate 21; 21 denotes a two-input AND gate; 22 represents a coincidence signal which is produced from a waveform discriminator 31; 23 shows an auto-range enable flip-flop which is set by a preset start signal 44 and reset by the coincidence signal 22; 24 refers to an auto-range enable signal; 25 indicates a three-input AND gate circuit; 26 identifies a range changing signal which is produced when the coincidence signal 22 is not derived from the waveform discriminator 31 during the read out mode of the memory 7; 27 denotes a digital comparator for comparing a 10-bit data train read out from the first memory 7 with 10-bit data (a threshold level) from a second memory 29; 28 represents a % calculator, by which a 10-bit threshold value corresponding to m% of the amplitude of the input signal is calculated from the maximum value and the minimum value detected by the peak detector 6 and a threshold m% value preset by a search condition setting circuit 42 and, by which the threshold value is set in the second memory 29; 29 shows a second memory for storing the 10-bit threshold value calculated by the % calculator means 28 and for providing the data to the digital comparator 27; 30 refers to a comparison result signal which is provided from the digital comparator 27; and 31 indicates a waveform discriminator which generates the coincidence signal upon coincidence of a search slope 33 preset by the search condition setting circuit 42 with a search slope number 34 when the sampled data are sequentially read out from the first memory 7 and compared by the digital comparator 27 with the threshold value, thereby to detect whether or not there exists in the sampled data train sample points which satisfy the search conditions 43, 33 and 34 preset by the search condition setting circuit 42.

Reference numeral 32 indicates clock pulses synchronized with the data read from the first memory 7 for waveform discrimination; 33 designates a search slope signal which is derived from the search condition setting circuit 42; 34 identifies a search slope number signal which is provided from the search condition setting circuit 42; 35 denotes a control device constituted by a sequence controller 36 and the search condition setting circuit 42 etc.; 36 represents a sequence control circuit which is employed for sampling the input signal or for reading out contents of the first memory 7 in response to the operation of the counter 8; 37 shows a control signal circuit which provides the signal 16 for controlling whether to sample the input signal or to read out contents of the first memory 7; 38 refers to a control signal circuit which generates a signal 50 for determining an enlarged sweep mode for search or a normal sweep mode; 39 indicates a delay setting circuit which receives the delay established signal 20 to produce a first delay set signal 51 and a second delay set signal 82 for setting a value "200" corresponding to a search delay bias value, $V_{DR}$, in an enlarged delay latch; 40 designates a range setting control circuit for setting a certain value in a range counter 74 during the normal sweep mode to set a time base range and for controlling the sweep to return to an initial range when the range-over is caused due to the range changing signal 26 during the auto-range sweep; 41 identifies a display unit for displaying the current time base; 42 denotes a search condition setting circuit for setting search conditions including the search slope 33, the search slope number 34 and the % value 43; 43 represents a % value of a maximum amplitude of the input signal for determining the search level; 45 shows a clock pulse generator; 51 refers to a delay setting signal for setting the output value 10 of the counter 8 in a delay latch circuit 72; 52 indicates a range-over signal which is produced when the range counter 74 overflows; 53 designates a time base range setting signal for the normal sweep which is provided from the range setting circuit 40; 54 identifies an output signal from the range counter 74 which indicates the current time base range.

In FIG. 2, reference numeral 60 indicates a trigger input terminal to which is applied a trigger signal synchronized with the input signal to the input terminal 1; 61 designates a trigger circuit which shapes and counts down the trigger signal fed from the trigger input terminal 60; 62 identifies a first signal generator for deriving from the trigger signal counted down by the trigger circuit 61 a high-speed sawtooth signal 76 which has a slope dependent on the value of one of capacitors $C_1$ to $C_n$ selected by any one of switches $S_{A1}$ to $S_{An}$ and the value of a constant current applied to the selected capacitor; 63 denotes an analog comparator for comparing the high-speed sawtooth signal 76 and a low-speed sawtooth signal 77 to generate a coincidence signal when respective instantaneous levels of the two signals coincide with each other; 64 represents a pulse generator for generating the sampling pulses 3 in response to the coincidence signal from the analog comparator 63; 65 shows an analog adder for adding together a DC voltage 78 and the low-speed sawtooth signal 79 to control a delay time; 66 refers to an inverting amplifier which receives a signal passing through either one of electronic switches $S_3$ and $S_4$; 67 indicates a buffer amplifier which has in its input a variable attenuator composed of resistors $R_1$ to $R_l$ and electronic switches $S_{B1}$ to $S_{Bl}$; 68 designates a D/A converter for converting the 10-bit output signal from the counter 8 to an analog voltage; 69 identifies a D/A converter for converting a delay value represented by 10 bits, latched in a delay latch circuit 72, to an analog voltage; 70 and 71 denote logical inverting elements (inverters) for driving electronic switches $S_1$ to $S_4$ by the signal 50; 72 represents a two-input delay latch circuit for latching a delay value based on the counter output signal 10 or "200" by the first delay setting signal 51 and a delay setting input 82; 73 shows an output buffer amplifier for buffering the output from the D/A converter 68 to produce an X-axis signal of a display; 74 refers to a counter for holding a time base range value; 75 indicates a time base range decoder for decoding the output 54 from the counter 74 to drive one of the switches $S_{A1}$ to $S_{An}$ and one of the electronic switches $S_{B1}$ to $S_{Bl}$; 76 designates a high-speed sawtoothed signal which is derived from the first signal generator 63; 77 identifies a low-speed sawtooth signal which is DC-biased by the analog adder 65; 78 denotes a DC output signal from the inverting amplifier 66; 79 represents an output signal from the buffer amplifier 67; 80 shows an output signal from the D/A converter 69; 81 refers to an X-axis signal; and 82 indicates a second delay setting signal which is provided from the delay setting circuit 39 for setting "200" in the delay latch circuit 72 during the enlarged sweep mode.

In FIG. 1, reference numeral 90 designates a control circuit for controlling the A/D conversion and the read and write of the first memory 7 and for generating the clock pulses 32; 91 and identifies an A/D conversion start signal; 92 denotes a conversion end signal; and 93 represents a first memory read/write signal.

The operation of the present embodiment is as follows: When the signal 50 has the logic "1," the switches $S_1$ and $S_3$ are conductive while the switches $S_2$ and $S_4$ non-conductive. By the signal 82 from the delay setting circuit 39, a value "200" is latched in the delay latch circuit 72. The value "200" which is the delay value represented by the binary 10 bits and corresponds to about 1/5 of a maximum value "1023" of the counter 8 is a value corresponding to a time point which lies up to a distance 1/5 from the beginning of a display width on the X-axis. The value "200" latched in the delay latch circuit 72 is converted by the D/A converter 69 to an analog voltage, which is applied to the switch $S_1$ and attenuated to provide the voltage signal 79. The output signal 10 from the counter 8 is converted by the D/A converter 68 to an analog voltage, which is provided via the switch $S_3$ to the inverting amplifier 66 to derive therefrom the signal 78. Unlike in the case of the normal sampling operation, the low-speed sawtooth signal corresponding to the X-axis signal is added in the analog adder 65 without attenuation. By making maximum output voltages of the D/A converters 68 and 69 to be equal to each other, it is possible to sweep by the low-speed sawtooth signal 79 over a delayable range in the time base range.

Figure 3:
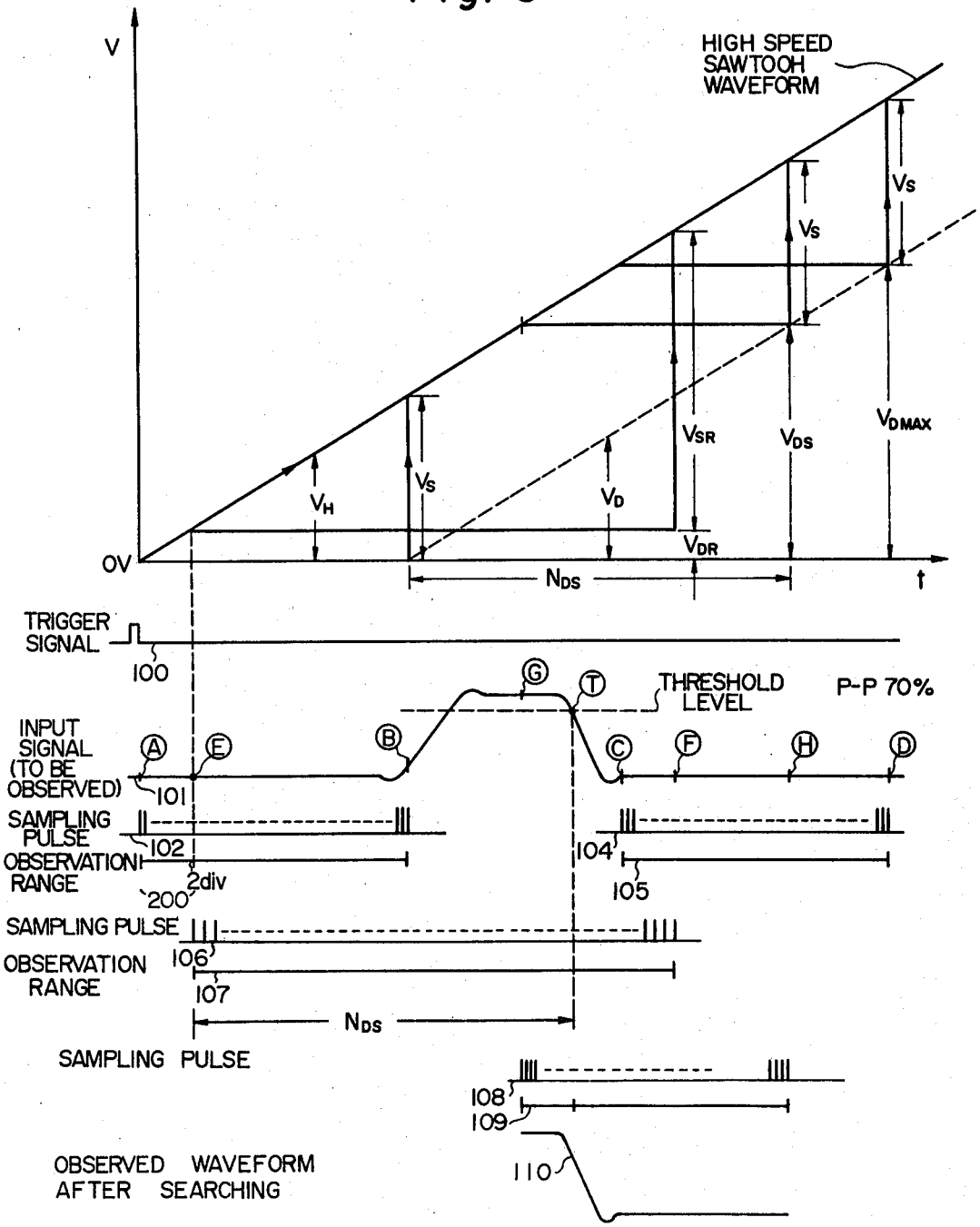
FIG. 3 is a timing chart explanatory of the operation of the present invention.

In FIG. 3, reference character $V_{DR}$ indicates a voltage 79 to which the voltage 80 corresponding to the delay value "200" has been attenuated; $V_{SR}$ designates a maximum output voltage of the D/A converter 68, which is equal to $V_{DMAX}$. As in the normal operation, the input signal is sampled by the sampling pulses, which are sequentially delayed from the trigger signal, and converted by the A/D converter 5 to a digital value, thereafter being stored in the addresses of the first memory 7 which is determined by the value of the counter 8.

A description will be given first of the normal sampling operation. A periodic signal to be measured is applied to the input terminal 1, and a trigger signal which is synchronized with the input signal to the input terminal 1 is applied to the trigger input terminal 60. By setting the time base range for observation in the counter 74, any one of the capacitors $C_1$ to $C_n$ is grounded via a corresponding one of the switches $S_{A1}$ to $S_{An}$ to determine the slope of the signal 76 which is generated by the first signal generator 62. At the same time, any one of the switches $S_{B1}$ to $S_{Bl}$ becomes conductive and the attenuation ratio of the signal applied from the switch $S_1$ or $S_2$ is determined by the resistors $R_1$ to $R_l$. During the normal sampling operation, when the signal 50 is set to the logic "0," the switches $S_2$ and $S_4$ are made conductive and the switches $S_1$ and $S_3$ non-conductive. As a consequence, the output signal from the D/A converter 68 attenuated by the resistors $R_1$ to $R_l$, that is, the low-speed sawtooth signal 79, which is not biased as is the case with the X-axis signal, and the DC voltage 78, which corresponds to the delay digital value set by the delay latch circuit 72 in response to the delay setting signal 51 supplied from the delay setting circuit 39, are applied to the analog adder 65, whose output 77 becomes a low-speed sawtooth signal synchronized with the X-axis signal biased by the DC voltage 78. By setting the output signal 16 from the control signal circuit 37 to the logic "0" and by producing the preset start signal 44 from the sequence controller 36, the counter 8 is set to the logic "0" and the maximum value and the minimum value of the peak detector 6 are reset, with a result that the output from the flip-flop 14 assumes the logic "1" and the sampling pulse 3 is applied as the counter drive signal. Assuming that the output from the latch circuit 72 is the logic "0," the DC voltage 78 becomes 0 volt and an output obtained by attenuating the output from the D/A converter 68 is provided as the low-speed sawtooth signal 77. Letting a value Vs stand for the level of the output signal 79 when the output 10 from the counter 8 becomes maximum, the signal 77 becomes a low-speed sawtooth signal 79 which varies from 0 volt to Vs in synchronism with the X-axis sweep. The high-speed sawtooth signal 76 produced by the trigger input signal 60 is compared with the low-speed sawtooth wave 77 in the analogue comparator 63, and when they coincide with each other, the sampling pulse 3 is generated and the signal to be measured is sampled in the sample hold means 2 and, at the same time, the counter 8 counts up its count value by "1." The signal to be measured, thus sampled by the sample hold means 2, is applied to the buffer amplifier 4 to provide an X-axis signal and one sampled value of the signal to be measured is displayed on the display unit at the X-axis position which is determined by the output 10 from the counter 8. In FIG. 3, in a case where the trigger signal 100 and the signal to be measured 101 bear such a time relationship as shown, the compared voltage of the analog comparator 63 is varied by the trigger signal 100 from 0 to Vs in a sequential order and, at the same time, the sampling pulses are sequentially delayed with respect to the trigger signal by a constant period of time and, as a result of this, the part from a point A to a point B on the signal to be measured 101 is displayed on the display unit 41. By varying the delay voltages 80 (i.e. $V_D$), the observation range is shifted on the signal 101 and when the output signal 80 is $V_{DMAX}$, the sampling pulses are generated as indicated by 104 and the display is provided within the range from a point C to point D.

It is a defect of the prior art sampling oscilloscope that a desired waveform is not always displayed in dependence on the time relationship between the trigger signal and the signal to be measured and the set time base range delay setting value. Namely, the prior art requires the selection of a delay and the time base range for displaying the desired waveform on the display unit at all times.

Next, a description will be given of the waveform search for automatically displaying a desired waveform on the display unit in accordance with the present invention. The portion of the signal to be measured which is desired to observe is preset as a search condition. The threshold value which is specified in terms of the percentage of the maximum amplitude of the signal to be measured is set to, for example, 70%. Further, the slope of the signal to be measured when it crosses to the threshold value is set to be, for instance, + or − depending on whether the signal to be measured rises or falls. Moreover, the number of times by which the slope of the signal to be measured crosses to the threshold value is specified. In order that the part on the signal to be measured which satisfies the abovesaid search conditions may be automatically displayed on the display unit, it is tested whether or not the signal to be measured lies within the display range on a certain time base and if the signal lies within the range, then a delay value for displaying the signal to be measured is automatically determined and, if not, the time base range is changed for the abovesaid test.

At first, the abovesaid three search conditions are set in the % calculator 28 and the waveform discriminator 31 by the signals 33, 34 and 43 from the search condition setting circuit 42. From the control signal circuit 38 is provided the signal 50 as a signal of the logic "1," to perform the enlarged sweep. From the control signal circuit 37 is produced the signal 16 in the form of the logic "0." By the signal 44 from the sequence controller 36 the counter 8 is reset to the logic "0" and the maximum value and the minimum value of the peak detector 6 are reset and, further, the waveform discriminator 31 is also reset. A maximum value and a minimum value of the digital value train converted to digital form are detected by the peak detector 6. The conversion by the A/D converter 5, the detection by the peak detector 6 and the storing of the first memory 7 are controlled by the control circuit 90 in synchronism with the sampling pulses 3. During the sampling the waveform discriminator 31 is not operative since the discriminating clock pulses 32 are not generated. By a series of sampling pulses which is started by the preset signal 44, enlarged sample values of the input signal are stored in the first memory 7 and the maximum and minimum ones of the sampled values are detected by the peak detector 6 and the sampling is stopped by the signal 11. In FIG. 3, during the abovesaid enlarged sweep operation, the part from a point E to F on the input signal 101 is sampled by the sampling pulse train 106 and stored as digital values in the first memory 7. After the enlarged sweep operation, in the % calculator 28 the maximum amplitude of the input signal is obtained by calculation from the detected maximum and minimum values of the sampled values of the input signal, and the threshold value is obtained from the preset % value 43 and is stored in the second memory 29. Next, the signal 16 from the control signal circuit 37 is rendered to have the logic "1." By the preset start signal 44 the output from the counter 8 is made the logic "0," the waveform discriminator 31 is reset and the flip-flop 23 is set to establish the output signal 24 in the state of the logic "1." When the signal 15 has the logic "1," the counter 8 is driven by the clock pulses from the clock pulse generator 45. Under the control of the control circuit 90 the stored data of the first memory 7 are sequentially read out therefrom on the data bus 18 in synchronism with the clock pulses. Further, in synchronism with the above reading out of the first memory 7 the discriminating clock pulses 32 are provided from the control circuit 90, and the threshold value of the second memory 29 and the value on the data bus 18 are compared by the digital comparator 27 with each other, so that the compared output 30 is applied to the waveform discriminator 31 together with the pulses 32. When the digital value of the sampled input signal meeting with the aforementioned search conditions is read out, the waveform discriminator 31 produces the coincidence signal 22 and in a case of non-coincidence, no such coincidence signal is provided. If the data read out when the counter 8 reaches a certain value coincide with the search conditions, the coincidence signal 22 passes through the gate 21 to provide the delay establish signal and, at the same time, it is applied via the gate 19 to the flip-flop 14 to reset it for stopping the supply of the clock pulses to the counter 8 to complete the read-out operation. The delay setting circuit 39 receives the signal 20 to apply the delay setting signal 51 to the delay latch circuit 72 for storing therein the output signal 10 derived from the counter 8 at that time. Let it be assumed that the search conditions are such that the threshold value is 70%, the slope is — and the number of times of crossing to the threshold value by the signal to be measured is "1." In such a case, letting $N_{DS}$ stand for the value of the counter 8 when reading out the stored digital value corresponding to a point T on the input signal 101, the output voltage from the D/A converter 69 becomes such as indicated by $V_{DS}$ when setting the abovesaid value $N_{DS}$ in the delay latch circuit 72. When setting the delay value $N_{DS}$ and performing the normal sample sweep operation, the sampling pulses are generated after the trigger signal, as indicated by 108, and the display range extends from a point G to a point H on the input signal 101, thus displaying the desired portion of the waveform. If no coincidence signal is provided from the waveform discriminator 31 during the aforesaid read-out operation of the memory 7, since the signals 16 and 24 are both in the state of the logic "1," the range changing signal 26 is generated by the signal 11 to advance the count value of the range counter 74 by "1" to change the time base range and then the aforementioned enlarged sweep operation and the memory read-out operation are carried out again to continue the waveform search until the search conditions are satisfied. Since the repetition frequencies of the sampling pulses 3 and the clock pulses 9 are set to about 80 kHz and 500 kHz, respectively, the enlarged sweep time is approximately 13 ms and the memory read-out time is about 2 ms at maximum.

Figure 4:
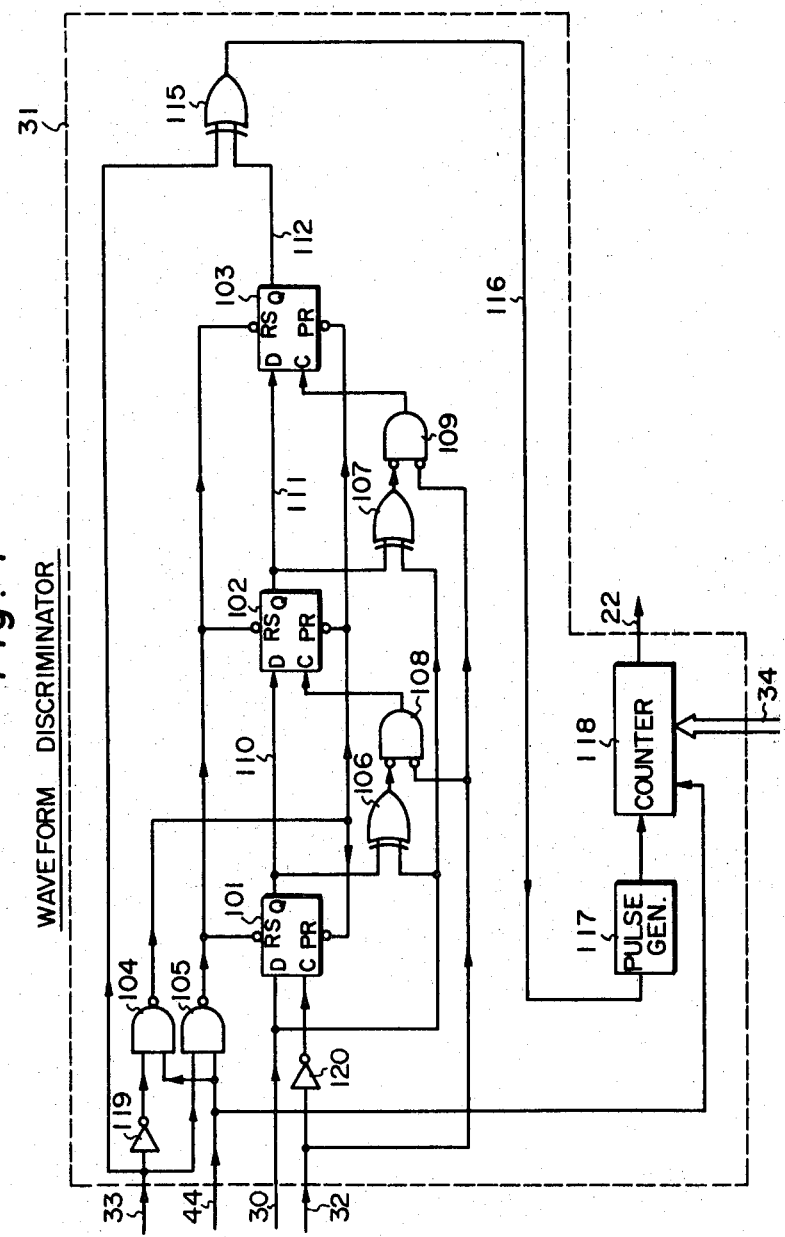
FIG. 4 is a block diagram showing an example of a waveform discriminator for use in the present invention.

FIG. 4 illustrates a specific example of the waveform discriminator 31. Reference numerals 101, 102 and 103 respectively indicated cascade-connected D flip-flops; 104 and 105 designate two-input NAND gates for setting by a preset signal 44, the outputs from the flip-flops 101, 102 and 103 to the polarity dependent on the polarity setting signal 33 during the initialization; 106 and 107 identify two-input exclusive OR gates; 108 and 109 denote negative input AND gates; 110 represents the output signal from the flip-flop 101; 111 shows the output signal from the flip-flop 102; 112 refers to the output signal from the flip-flop 103; 115 indicates a two-input exclusive OR gate for controlling the logical polarity of a signal 116 by the signal 33; 116 designates a signal polarity-inverted by the exclusive OR gate 115; 117 identifies a pulse generator for generating pulses at each positive edge of the output of the exclusive OR gate 115; 118 denotes a counter which, at each negative edge of the abovesaid pulse, counts down one by one the value of the signal 34 initialized by the preset signal 44 and generates the signal 22 when the count value reaches "0;" and 119 and 120 represent logical inverters.

Figure 5:
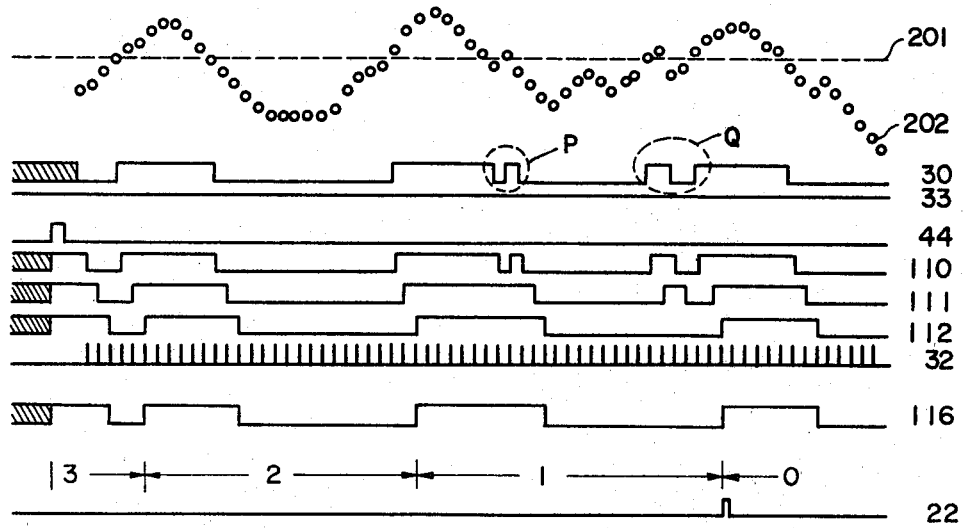
FIG. 5 is a timing chart explanatory of the operation of the specific example shown in FIG. 4.

FIG. 5 shows the timing chart of the operation of the waveform discriminator 31. In FIG. 5, reference numeral 201 indicates the threshold value set in the second memory 29; and 202 designates the sample value train stored in the first memory 7. In a case where the number of times of crossing the value of the signal 34, that is, the threshold value is three and the slope searched is rising, the coincidence signal 22 is produced at the timing shown in FIG. 5.

If a slope to be searched is a rising slope, the signal 33 assumes the state "0." Moreover, if the number of slopes is three, namely, the third slope closing the threshold value is to be searched, a preset signal "3" is stored in the counter 118. This waveform discriminator 31 has a function for removing quick variation portions (P and Q in FIG. 5) in the comparison output 30 from the digital comparator 27 in addition to slope-discrimination function and slope-counting function. The state of the comparison output 30 is changed in synchronism with discrimination clock pulses 32. Each of the quick variation portions is less than three discrimination clock periods.

Respective outputs 110, 111 and 112 of the flip-flops 101, 102 and 103 becomes logic "1" in response to the present signal 44. Although the state of the comparison output signal 30 may be the state "1" or "0" by sampled pulses (202 shown in FIG. 5) at the timing of the first one of the clock pulses 32, outputs 110, 111 and 112 of the flip-flop 101, 102 and 103 are reset to the state "1" or "0" in case of the slope state "+" and "—," respectively, of the search slope to avoid generation of any erroneous polarity-detection pulse from the pulse generator 117.

The comparison output signal 30 is latched to the flip-flop 101 by one of the clock pulses 32. At the next one of the clock pulses 32, the gate 108 is opened when the states of the signal 110 and the comparison output signal 30 coincide with each other, so that clock pulses 32 are applied to the flip-flop 102 thereby to latch the signal 110 to the flip-flop 102. If the state of the signal 110 does not coincide with the state of the comparison output signal 30, the state of the flip-flop 102 is not changed. The operations of the flip-flop 103 are similar to the above. In FIG. 5, the duration of the part "P" is equal to one period of the clock pulses 32. The part "P" is removed at the signal 111 as shown. Moreover, although the duration of the part "Q" is equal to two periods of the clock pulses 32, this part "Q" is also removed at the signal 112. If n circuit blocks each comprising elements 106, 108 and 102 by way of example are connected in cascade, quick variations less than n clock pulse periods can be removed. Since the signal 33 is the state "0," the signal 112 is transferred as the signal 116, so that signal 116 from the pulse generator 117 counts the number of slopes. The counter 118 counts the output pulses of the pulse generator 117 so as to count "−1" for each slope, so that a coincidence pulse 22 is generated when the counted value of the counter 118 becomes "0."

In analog circuits, a comparator may have a voltage hysteresis characteristic. However, it is difficult that a comparator in a digital circuit have a voltage hysteresis characteristics. This waveform discriminator 31 has a function of a time-base filter. In a sampling oscilloscope, sampling noise will frequently cause quick variation or noise in the input signal. Erroneous operation caused by these noises can be eliminated by this waveform discriminator 31.

As has been described in the foregoing, in accordance with the present invention, when an input signal meeting with set conditions predetermined for observation is received, it is possible to automatically obtain a display waveform which is optimal to the set conditions and easy to observe; accordingly, the present invention is of great utility when employed for observations of various waveforms.

What we claim is:

1. In a waveform searching system for a sampling oscilloscope, in which the instantaneous level of a high-speed sawtooth signal generated by a trigger signal synchronized with an input analog signal and the instantaneous level of a properly attenuated or amplified X-axis sweep wave are compared with each other to generate a pulse in a case of coincidence therebetween, thereby to generate sampling pulses sequentially delayed after the trigger signal by a constant time; the input analog signal is sampled by the sampling pulses to produce sampled pulses; and the sampled pulses are displayed by the X-axis sweep signal on a CRT, the improvement comprising detecting means for producing a coincidence signal if a predetermined condition is detected where a waveform formed by respective peak values of the sampled pulses crosses in a predetermined direction at a predetermined search level by a predetermined number; and control means operatively connected to the detection means for sequentially changing a time base range of the CRT until said detecting means produces the coincidence signal, whereby the sampled pulses having the predetermined condition are automatically displayed on the CRT.

2. In a waveform searching system for a sampling oscilloscope, in which the instantaneous level of a high-speed sawtooth signal generated by a trigger signal synchronized with an input analog signal and the instantaneous level of a properly attenuated or amplified X-axis sweep wave are compared with each other to generate a pulse in a case of coincidence therebetween, thereby to generate sampling pulses sequentially delayed after the trigger signal by a constant time; the input analog signal is sampled by the sampling pulses to produce sampled pulses; and the sampled pulses are displayed by the X-axis sweep signal on a CRT, the improvement comprising detecting means for producing a coincidence signal if a predetermined condition is detected where a waveform formed by respective peak values of the sampled pulses cross in a predetermined direction at a predetermined search level by a predetermined number; and control means operatively connected to the detection means for sequentially changing a time base range of the CRT determined by the inclination of the high-speed saw-tooth signal and the amplitude of the X-axis sweep voltage wave until the detecting means produces the coincidence signal, whereby the sampled pulses having the predetermined condition are automatically displayed on the CRT.

* * * * *